United States Patent [19]

Boecker et al.

[11] Patent Number: 5,123,019
[45] Date of Patent: Jun. 16, 1992

[54] METHOD FOR PROCESSING BINARY CODE WORDS

[75] Inventors: Gerd Boecker, Munich; Rostislav Kaderka, Germering; Rudolf Krumenacker, Munich, all of Fed. Rep. of Germany

[73] Assignee: Siemens Aktiengesellschaft, Berlin and Munich, Fed. Rep. of Germany

[21] Appl. No.: 471,198

[22] Filed: Jan. 26, 1990

[30] Foreign Application Priority Data

Jan. 27, 1989 [EP] European Pat. Off. ........ 89101434.2

[51] Int. Cl.⁵ .............................................. G06F 11/10
[52] U.S. Cl. .................................. 371/51.1; 371/49.1
[58] Field of Search ............... 371/51.1, 49.1, 48, 371/29.5

[56] References Cited

U.S. PATENT DOCUMENTS

| | | | |
|---|---|---|---|
| 4,051,355 | 9/1977 | Lin | 371/51.1 |
| 4,103,823 | 8/1978 | Aichelmann, Jr. et al. | 371/51.1 |
| 4,155,070 | 5/1979 | Munter | 371/49.1 |
| 4,271,521 | 6/1981 | Mahmood | 371/51.1 |
| 4,291,408 | 9/1981 | Ogawa et al. | 371/49.1 |
| 4,355,393 | 10/1982 | Kubo et al. | 371/51.1 |
| 4,429,391 | 1/1984 | Lee | 371/49.1 |
| 4,580,265 | 4/1986 | Goodings | 371/49.3 |
| 4,700,358 | 10/1987 | Duncanson et al. | 375/8 |
| 4,730,320 | 3/1988 | Hidaka et al. | 371/40.4 |
| 4,774,712 | 9/1988 | Lewis | 371/51 |
| 4,876,686 | 10/1989 | Sasaki et al. | 371/49.1 |

Primary Examiner—Jerry Smith
Assistant Examiner—Ly V. Hua
Attorney, Agent, or Firm—Jeffrey P. Morris; Lawrence C. Edelman; Adel A. Ahmed

[57] ABSTRACT

In a method for processing incoming code words that are accompanied by parity bits and that, in the course of being transmitted, undergo a digital attenuation and/or a code conversion for generating further code words that are to be transmitted, the code words and the parity bits are subjected to parity tests for indicating whether parity errors exist prior to the performance of the digital attenuation and/or code conversion. Then, for each of the further code words a further parity bit is generated that is also to be transmitted, but that is inverted, if the parity test of a corresponding code word has shown that a parity error exists.

12 Claims, 2 Drawing Sheets

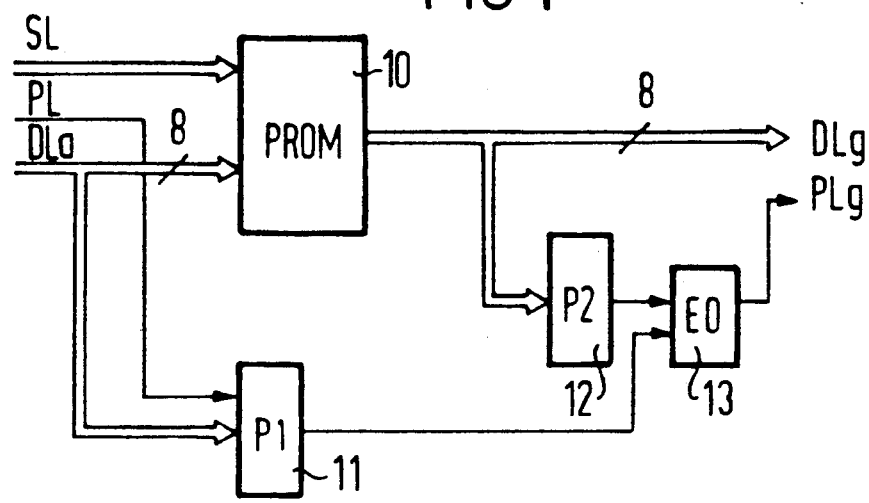
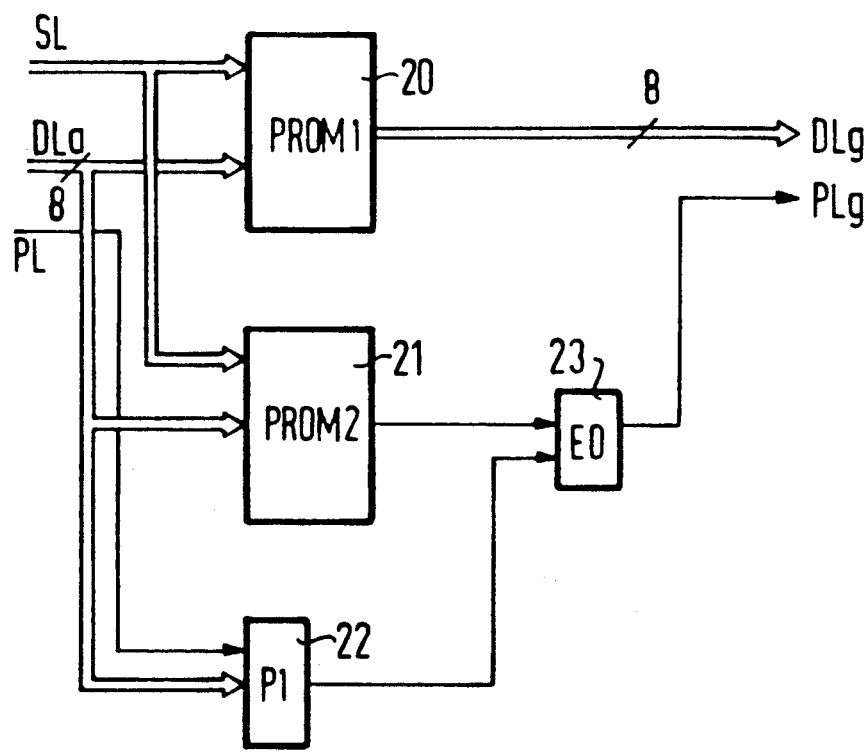

METHOD FOR PROCESSING BINARY CODE WORDS

BACKGROUND OF THE INVENTION

1. Field of the Invention

The invention relates to a method for processing binary code words that can be parity controlled, and which, in the course of being transmitted, undergo a digital attenuation and/or code conversion.

2. Description of the Prior Art

Such a method is of interest, for example, in connection with the transmission of voice/data information in peripheral line groups of digital switching systems in which the binary code words representing the voice and data information are accompanied by a parity bit and, particularly when they are used in connection with conference calls, pass through a circuit arrangement that is designed to generate a digital attenuation, which, if necessary, also effects a code conversion from a code representation corresponding to the A-law to a code representation corresponding to the $\mu$-law and vice versa. By means of this latter procedure, the switching system is adapted to the respective country-specific coding that is provided in the telecommunication network in which the switching system is being used. "Attenuation and/or code conversion" implies that the first code words undergo a digital attenuation with an independent code conversion or just a code conversion or both. This will be referred to as a digital conversion.

The generation of a digital attenuation or a code conversion can cause the code words leaving the device that is used to generate such an attenuation and/or code conversion to have a different parity than the corresponding code words prior to such treatment, for which reason a parity bit must be formed afresh for the code words to be transmitted that have been subjected to an attenuation and/or conversion. However, this also means that under certain circumstances parity errors in the incoming code words cannot be detected in the course of code control that takes place at a central location.

SUMMARY OF THE INVENTION

It is an object of the invention to provide a method for processing incoming code words that can be parity controlled, which ensures that parity errors that already exist are not made undetectable as the result of performing a digital attenuation and/or code conversion.

This object is achieved by a method in which the incoming code words and accompanying parity bits are subject to parity tests for indicating whether parity errors exist prior to the performance of the digital attenuation and/or code conversion, during which further code words to be transmitted are generated. Then, for each further code word a further parity bit is generated that is also to be transmitted, but that is inverted before the transmission, if the parity test of a corresponding incoming code word has shown that a parity error exists.

It is useful to perform the digital attenuation and/or code conversion through the read-out of a read-only memory, which is addressed by the incoming code words and control bits and which stores the further code words. In this case, the method can be implemented with a relatively small expenditure of hardware, if the further parity bits are generated after the further code words are read out from this first read-only memory. But, this implementation has a comparatively long response time.

If the further parity bits are stored in a further read-only memory, which is read out simultaneously with the before mentioned read-only memory under the same addresses as the respective first code words, then such an implementation is more advantageous with respect to the delay, but it requires more power.

If each of the further code words is stored in the read only memory without its most significant bit, which is the sign bit for determining the sign, and if these sign bits are used as sign bits of the further code words, then such an embodiment is the most favorable one in terms of hardware expenditure and power consumption. With respect to delay it lies between the other above mentioned embodiments, this delay always being smaller than one clock pulse period of the fastest system clock of a typical switching system of the type described before (8.192 MHz), so that, the delay can be accepted. In this case, the read-only memory stores further parity bits for the remaining portions of the further code words, and the further parity bit is inverted if the parity test of a corresponding incoming code word has shown that a parity error exists or if the sign bit of the corresponding incoming code word has a binary value whose parity is being tested. If the parity of the 1 bits is being tested, then it is advantageous that the sign bits of the incoming code words and the result bits generated after the parity tests are combined according to an EXCLUSIVE-OR function, and that the result of said EXCLUSIVE-OR function is likewise combined with the further parity bits for the remaining portions of the further code words according to an EXCLUSIVE-OR function for the determination of the binary value of the further parity bits to be transmitted.

Additional objects and features of the invention will be more readily appreciated and better understood by reference to the following detailed description which should be considered in conjunction with the drawings.

BRIEF DESCRIPTION OF THE DRAWINGS

FIG. 1 depicts a block diagram of an arrangement to implement a first embodiment of the method according to the invention.

FIG. 2 illustrates a block diagram of an arrangement to implement a second embodiment of the method according to the invention.

DETAILED DESCRIPTION

Figure 3:
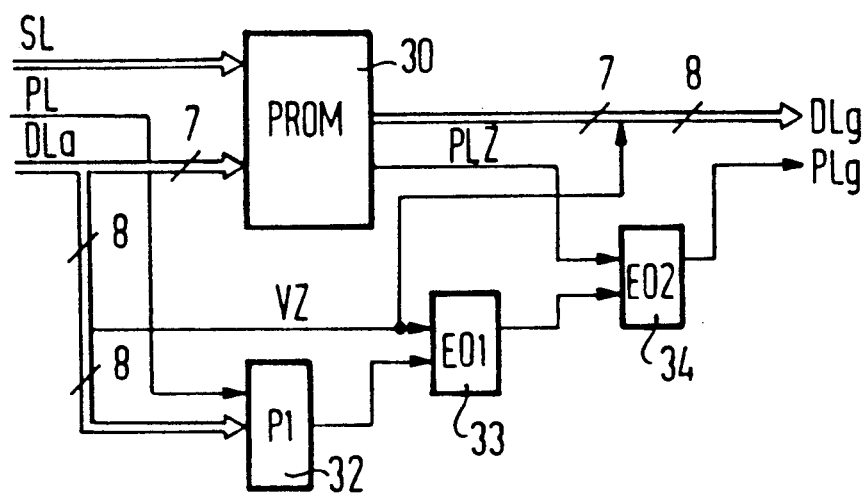
FIG. 3 shows a block diagram of an arrangement to implement a third embodiment of the method according to the invention.

FIG. 1 shows a programmable read-only memory PROM 10 as the essential component of a device with the aid of which a digital attenuation and/or a code conversion can be accomplished. To the input side of this memory 10 there is connected a data line DLa for the incoming transmission direction, on which, in this case binary code words composed of 8 bits are transmitted which can be parity controlled, because each of them is accompanied by a parity bit transmitted on a separate line PL. Also connected to the input side is a control-line multiplex SL, on whose individual lines are supplied control bits that determine the nature of the digital attenuation and/or code conversion that is to be performed. The bits arriving on the abovementioned lines DLa and SL serve as addresses for the memory PROM 10.

Connected to the output side of the memory 10 is a data line DLg for the outgoing transmission direction.

In the read-only memory PROM are contained code words that represent information units that have been attenuated with respect to the corresponding coded information units arriving on the data line DLa to an extent that is determined by assigned control bits on the control bus SL. It also contains code words that represent these attenuation information units in a second code representation, that is, for example in the code representation according to the A-law, if the corresponding code words are coded according to the $\mu$-law, and vice versa.

The performance of a digital attenuation and/or code conversion of the binary code words arriving on the data line DLa for the incoming transmission direction thus takes place in this case in such a manner that these binary code words, together with the control bits giving the desired attenuation and/or code conversion select the storage location in which is stored the code word representing the desired attenuated information value in the desired code representation, which code word thereupon arrives at the transmission line DLg for the outgoing transmission direction.

In the course of performing this kind of digital attenuation and/or code conversion, it can naturally occur that the code words that are read out and transmitted have a different parity than the one accompanying the code words on the transmission line DLa for the incoming transmission direction, so that a possible parity error of the incoming code words can no longer be detected in the course of a code monitoring subsequently conducted at a central location.

In order to ensure that the data read out from the memory PROM 10 and transmitted together with a parity bit are transmitted with a parity error whenever a parity error is detected in the corresponding incoming data, the following procedure is used in the embodiment according to FIG. 1: The bits resulting from a parity control performed with the aid of a first parity generator 11 P1 on the code words arriving on the transmission line DLa for the incoming transmission direction are linked with the parity bits formed by a second parity bit generator 12 P2 for the code words read out from the memory PROM 10 according to an EXCLUSIVE-OR 13 function, which then produces the parity bits destined for transmission on the corresponding line PLg.

Since, if we assume that a parity of the 1 bit is desired, the first parity bit generator 11 P1 will always deliver, in the course of a parity control procedure, a result bit with the binary value 0 if the parity is correct, and, on the other hand, a result bit with the binary value 1 if there is a parity error; the result is that in the event of a parity error for the incoming binary code words, the parity bit (which is formed by the parity bit generator 12 P2) of the corresponding binary code words that are read out of the memory 10 and are to be transmitted, which is formed by the parity generator 12 P2, undergoes an inversion, so that the code words that are then transmitted together with the parity bit have a parity error, which can then be detected and recorded at a central location.

Since in the arrangement shown in FIG. 1 three delay periods, namely the delay period of the memory PROM 10, that of the second parity generator 12 P2 and that of the EXCLUSIVE-OR element 13 EO, are added to one another, we are dealing here with a device that operates relatively slowly.

The arrangement shown in FIG. 2 is more favorable in this respect. In addition to the programmable read-only memory 20 PROM1, which corresponds to the programmable read-only memory PROM 10 shown in FIG. 1, it has a second programmable read-only memory 21 PROM2, which is fed the same addresses as the first memory 20 PROM1, and in which the parity bits belonging to the code words contained in the first memory 20 are stored. The second parity generator 12 P2 shown in FIG. 1 can therefore be dispensed with; instead, the parity bits that are read out from the second memory 21 PROM2 simultaneously with the code words contained in the first read-only memory 20 PROM1 are fed directly to the EXCLUSIVE-OR element 23 EO, at whose other input the result bits supplied by the first parity generator 22 P1, which corresponds to the one shown in FIG. 1, are received. However, compared with the one shown in FIG. 1, this solution requires more assembly space in the course of the switching and leads, in particular, to a higher power loss.

A third variant of the process according to the invention, which is explained below with the aid of FIG. 3, can be realized with an arrangement which, both as regards the hardware expenditure and the power loss, is more favorable than the solutions explained with the aid of FIGS. 1 and 2 and which lies between these two solutions in terms of delay. Since, however, the delay is always shorter than one clock pulse period of the fastest system clock (e.g. 8.192 MHz), in a typical digital switching system (which is the preferred application for such a process), this last solution is to be regarded as the best.

The arrangement shown in FIG. 3 also shows a programmable read-only memory PROM 30, in which, however, the code words that correspond to the code words arriving on the data line DLa for the incoming transmission direction (taking into account a specific attenuation or a code conversion) are stored without the bit with the highest value, which determines the prefix. Accordingly, from the incoming code words, which might, for example, comprise 8 bits, only the 7 bits with a lower value are used as the address of the PROM 30. To these bits there are then added, as shown, several control bits which are supplied over control bus SL. Instead of the prefix bits, there are stored in the read-only memory PROM 30 the parity bits of the code words stored there, which, in the embodiment shown in FIG. 1, are formed only after the read-out with the aid of the parity generator 12 bit P2 and, in the embodiment shown in FIG. 2 are stored in the second read-only memory 21 PROM2.

The basic consideration underlying this concept is that the sign bit should undergo no change in the event of a digital attenuation or a code conversion. Therefore, the sign bits of the incoming binary code words, as indicated in the FIG. 3, are added once again to the code words read out from the read-only memory PROM 30, which comprise only 7 bits.

The parity of the incoming code words is controlled with the aid of a parity bit generator 32 P1, as in the embodiments shown in FIGS. 1 and 2, with assumed parities of the 1 bits being restored so that, when the parity is correct a result bit with the binary value 0 is inserted, and when there is a parity error a result bit with the binary value 1 is inserted.

Since the respective parity bit for the code words stored in the read-only memory PROM 30 is formed and stored in the read-only memory PROM 30 on the insertion of a sign bit with the binary value 0, then, under the abovementioned insertion of a parity check of the parity of the 1 bit, in cases in which the sign bit has the binary value 1, an inversion of the result bit of the parity bit generator 32 P1 must be performed, which is accomplished with the aid of a first EXCLUSIVE-OR element 33 EO1, to which there are fed as input signals the sign bits of the incoming code words on the line VZ, as well as the result bits of the parity bit generator 32 P1, and which then determines by its output signals whether or not the parity bits that are read out from the read-only memory PROM 30 and destined for transmission are to be inverted. This decision is made with the aid of a second EXCLUSIVE-OR element 34 EO2, to which there are fed the above-mentioned parity bits on the line PLZ, as well as the output signals of the first EXCLUSIVE-OR element 33 EO1, and which then performs an inversion of the said parity bits, if the EXCLUSIVE-OR element 33 EO1 emits an output signal with the binary value 1. Finally, the output signals of the EXCLUSIVE-OR element 34. EO2 are transmitted on the line PLg, together with code words that have been read out of the read-only memory PROM 30 and combined with the corresponding sign bit.

There has thus been shown and described a novel method for processing binary code words that can be parity controlled which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

We claim:

1. A method used for transmitting digital data from a first location to a second location, said method employed for processing incoming first code words to be processed that are accompanied by first parity bits and that, in the course of being transmitted, undergo a digital conversion for generating second code words that are to be transmitted to said second location, said method comprising the steps of:

applying said first code words and said first parity bits to a parity generator to parity test said applied words and bits for indicating whether parity errors exist prior to the performance of said digital conversion, storing second code words in a first memory where there is stored a second code word for each first code word and reading out said second stored code word and applying said second stored word to a parity generator to provide for each of said second code words a second parity bit that is to be transmitted together with each of said second code words, and inverting said second parity bit after the performance of said digital conversion and before the transmission to said second location, if said parity test of a corresponding first code word has shown that a parity error exists, and transmitting said second code word to said second location with said second parity bit after the step of inverting.

2. A method according to claim 1, wherein said memory is a read-only memory, which is addressed by said first code words and which stores said second code words, wherein result bits are generated as results of said parity tests, and wherein each of said second parity bits is combined with a result bit of a parity test of a corresponding first code word before said step of transmitting.

3. A method according to claim 2, where said parity test is performed on a parity of said bits having a binary value of one and wherein said combination of said second parity bits and said result bits is an EXCLUSIVE-OR function.

4. A method according to claim 3, wherein said second parity bits are generated after said second code words are read out from said first read-only memory.

5. A method according to claim 3, wherein said second parity bits are stored in a second read-only memory, which is read out simultaneously with said first read-only memory under the same addresses as the respective first code words.

6. A method according to claim 3, wherein each of said second code words is stored in said first read only memory without its most significant bit, which is the sign bit for determining the sign, wherein said sign bits are used as sign bits of said second code words, wherein said first read-only memory comprises second parity bits for the remaining portions of said second code words, and wherein a second parity bit is inverted if said parity test of a corresponding first code word has shown that a parity error exists or if said sign bit has a binary value whose parity is being tested.

7. A method according to claim 6, wherein parity of the 1 bits is being tested, wherein said sign bits of said first code words and said result bits of said parity tests are combined according to an EXCLUSIVE-OR function, and wherein the result of said EXCLUSIVE-OR function is likewise combined with said second parity bits for the remaining portions of said second code words according to an EXCLUSIVE-OR function for providing a new binary value of second parity bits to be transmitted.

8. A method according to claim 2, wherein said second parity bits are provided after said second code words are read out from said first read-only memory.

9. A method according to claim 2, wherein said second parity bits are stored in a second read-only memory, which is read out simultaneously with said first read-only memory under the same addresses as the respective first code words.

10. A method according to claim 2, wherein each of said second code words is stored in said first read only memory without its most significant bit, which is the sign bit for determining the sign, wherein aid sign bits are used as sign bits of said second code words, wherein said first read-only memory stores second parity bits for the remaining portions of said second code words, and wherein a second parity bit is inverted if said parity test of a corresponding first code word has shown that a parity error exists or if said sign bit of said second code word has a binary value whose parity is being tested.

11. A method according to claim 10, wherein parity of the 1 bits is being tested, wherein said sign bits and said result bits of said parity tests are combined according to an EXCLUSIVE-OR function, and wherein the result of said EXCLUSIVE-OR function is likewise combined with said second parity bits for the remaining portions of said second code words according to an EXCLUSIVE-OR function for providing a new binary value of second parity bits to be transmitted.

12. The method according to claim 1, wherein said digital conversion includes a digital attenuation and/or code conversion.

* * * * *